US012604525B2

(12) United States Patent
Jung et al.

(10) Patent No.: US 12,604,525 B2
(45) Date of Patent: Apr. 14, 2026

(54) DISPLAY DEVICE

(71) Applicant: Samsung Display Co., LTD., Yongin-si (KR)

(72) Inventors: Eunae Jung, Hwaseong-si (KR); Eun Hye Kim, Namyangju-si (KR); Ki Ho Bang, Hwaseong-si (KR); Won Suk Choi, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 799 days.

(21) Appl. No.: 17/870,921

(22) Filed: Jul. 22, 2022

(65) Prior Publication Data

US 2023/0154934 A1     May 18, 2023

(30) Foreign Application Priority Data

Nov. 17, 2021     (KR) ......................... 10-2021-0158739

(51) Int. Cl.
| | |
|---|---|
| *H10D 86/60* | (2025.01) |
| *H01L 23/00* | (2006.01) |
| *H10D 86/40* | (2025.01) |

(52) U.S. Cl.
CPC ............. *H10D 86/60* (2025.01); *H01L 24/02* (2013.01); *H01L 24/05* (2013.01); *H10D 86/441* (2025.01); *H01L 2224/02331* (2013.01); *H01L 2224/02373* (2013.01); *H01L 2224/02375* (2013.01); *H01L 2224/02381* (2013.01); *H01L 2224/05548* (2013.01); *H01L 2224/05562* (2013.01);

(Continued)

(58) Field of Classification Search
CPC .... H10D 86/60; H10D 86/451; H10D 86/441; H01L 24/02; H01L 24/05; H01L 2224/02331; H01L 2224/02373; H01L 2224/02375; H01L 2224/02381; H01L 2224/05548; H01L 2224/05562; H01L 2224/05567; H01L 2224/05573; H10K 59/131
See application file for complete search history.

(56) References Cited

U.S. PATENT DOCUMENTS

| | | | |
|---|---|---|---|
| 2011/0156995 A1* | 6/2011 | Choi ..................... | H10D 86/60 257/E21.409 |
| 2017/0365503 A1 | 12/2017 | Yang et al. | |
| 2020/0135822 A1* | 4/2020 | Park ................... | H10D 86/441 |

(Continued)

FOREIGN PATENT DOCUMENTS

| | | |
|---|---|---|
| KR | 10-0264162 B1 | 8/2000 |
| KR | 1020160082804 A | 7/2016 |

(Continued)

*Primary Examiner* — Victor A Mandala
(74) *Attorney, Agent, or Firm* — CANTOR COLBURN LLP

(57) ABSTRACT

A display device includes a display area and a non-display area which is adjacent to the display area, a pad in the non-display area and connected to the display area, and an insulating layer on the pad. A portion of the pad is exposed outside of the insulating layer to define an exposed portion of the pad, the insulating layer includes a first portion having a first thickness and a second portion having a second thickness which is less than the first thickness, and the second portion of the insulating layer is between the exposed portion of the pad and the first portion of the insulating layer.

20 Claims, 13 Drawing Sheets

(52) U.S. Cl.
 CPC ............... *H01L 2224/05567* (2013.01); *H01L 2224/05573* (2013.01)

(56) References Cited

U.S. PATENT DOCUMENTS

| | | | | |
|---|---|---|---|---|
| 2020/0176550 A1* | 6/2020 | Youn | .................... | H10K 59/124 |
| 2020/0350390 A1* | 11/2020 | Kim | .................... | H10K 59/124 |
| 2020/0356214 A1 | 11/2020 | Kim et al. | | |
| 2020/0356215 A1* | 11/2020 | Kim | .................... | G06F 3/0445 |
| 2020/0395428 A1* | 12/2020 | Baek | .................. | H10K 59/131 |
| 2021/0036076 A1* | 2/2021 | Kim | .................... | H10K 59/124 |
| 2021/0066432 A1* | 3/2021 | Lim | .................... | H10K 59/131 |
| 2021/0125566 A1* | 4/2021 | Yang | .................... | H10D 86/441 |
| 2022/0130930 A1* | 4/2022 | Yang | .................. | H10D 30/674 |
| 2022/0139970 A1* | 5/2022 | Kim | ....................... | H10D 86/60 |
| | | | | 257/72 |
| 2022/0140058 A1* | 5/2022 | Jung | ................... | H10D 86/443 |
| | | | | 257/40 |
| 2022/0173198 A1* | 6/2022 | Kim | .................. | H10K 59/1213 |
| 2022/0181427 A1* | 6/2022 | Yang | .................... | H10K 59/131 |

FOREIGN PATENT DOCUMENTS

| | | | |
|---|---|---|---|
| KR | 20170141840 | A | 12/2017 |
| KR | 1020180018966 | A | 2/2018 |
| KR | 10-2059321 | B1 | 12/2019 |
| KR | 10-2120817 | B1 | 6/2020 |
| KR | 20200129211 | A | 11/2020 |

* cited by examiner

VIA3

VIA2

VIA1

SD3  SD2  SD1          SUB

PD

VIA { VIA1
      VIA2
      VIA3

PR

190

VIA3

VIA2

VIA1

DISPLAY DEVICE

This application claims priority to Korean Patent Application No. 10-2021-0158739 filed on Nov. 17, 2021, and all the benefits accruing therefrom under 35 U.S.C. § 119, the entire contents of which are incorporated herein by reference.

BACKGROUND

(a) Field

The present disclosure relates to a display device, and particularly relates to a display device for minimizing steps of layers at a pad portion.

(b) Description of the Related Art

A display device includes a display panel including pixels for displaying images. A circuit, and a pad through which signals are input to the display panel for controlling the pixels and the circuit, are provided on the display panel in addition to the pixels. Signal lines which are connected to the pad and transmit the signals are also provided on the display panel.

The pad and the pixels may be formed (or provided) in the same process, and the pad may have a similar stacked structure to the pixels.

SUMMARY

One or more embodiment of the invention provides a display device for minimizing steps of a pad portion.

An embodiment of the invention provides a display device including a substrate including a display area and a non-display area, a plurality of pads in the non-display area, and an insulating layer overlapping a predetermined region of the pad. The pad includes an overlapping region overlapping the insulating layer, and a non-overlapping region not overlapping the insulating layer. The insulating layer includes a first portion with a first thickness and a second portion with a second thickness which is less than the first thickness. The second portion of the insulating layer is between the non-overlapping region of the pad and the first portion of the insulating layer.

A length of the second portion may be about 20 micrometers (μm) to about 100 μm.

A thickness of the second portion may be about 30% to about 50% of a thickness of the first portion.

The pad may include a first data conductive layer, a second data conductive layer and a third data conductive layer, and the insulating layer may include a first insulating layer between the first data conductive layer and the second data conductive layer, a second insulating layer between the second data conductive layer and the third data conductive layer, and a third insulating layer on the third data conductive layer.

An end of the second insulating layer may be nearer the non-overlapping region of the pad than an end of the first insulating layer.

An end of the third insulating layer may be nearer the non-overlapping region of the pad than an end of the second insulating layer.

The first insulating layer may include a first portion with a first thickness and a second portion with a second thickness which is less than the first thickness.

The second insulating layer may include a first portion with a first thickness and a second portion with a second thickness which is less than the first thickness.

The third insulating layer may include a first portion with a first thickness and a second portion with a second thickness which is less than the first thickness.

The display area may include a first conductive layer, a second conductive layer and a third conductive layer, the first data conductive layer of the pad may be in a same layer as the first conductive layer of the display area, the second data conductive layer of the pad may be in a same layer as the second conductive layer of the display area, and the third data conductive layer of the pad may be in a same layer as the third conductive layer of the display area.

The first data conductive layer and the second data conductive layer may contact each other in an opening of the first insulating layer, and the second data conductive layer and the third data conductive layer may contact each other in an opening of the second insulating layer.

The first data conductive layer may be connected to the display area, and the third data conductive layer may be exposed to outside the insulating layer at the non-overlapping region of the pad.

The insulating layer may further include a third portion with a third thickness which is less than the second thickness, and the third portion of the insulating layer may be between the non-overlapping region of the pad and the second portion of the insulating layer.

The first insulating layer may include a first groove between the neighboring pads.

A width of the first groove may be about 20 μm to about 100 μm.

The second insulating layer may include a second groove between the neighboring pads and corresponding to the first groove, and a lateral side of the first insulating layer which defines the first groove may be covered by the second insulating layer.

A width of the second groove may be less than a width of the first groove.

A lateral side of the second insulating layer which defines the second groove may be covered by the third insulating layer.

The first insulating layer may include a first portion with a first thickness and a second portion with a second thickness which is less than the first thickness, and the second portion may be between the first portion and the first groove.

The second insulating layer may include a first portion with a first thickness and a second portion with a second thickness which is less than the first thickness, and the second portion may be between the first portion and the second groove.

According to one or more of the embodiments, the display device having minimized steps at the pad portion is provided.

BRIEF DESCRIPTION OF THE DRAWINGS

The above and other advantages and features of this disclosure will become more apparent by describing in further detail embodiments thereof with reference to the accompanying drawings, in which.

DETAILED DESCRIPTION

Figure 1:
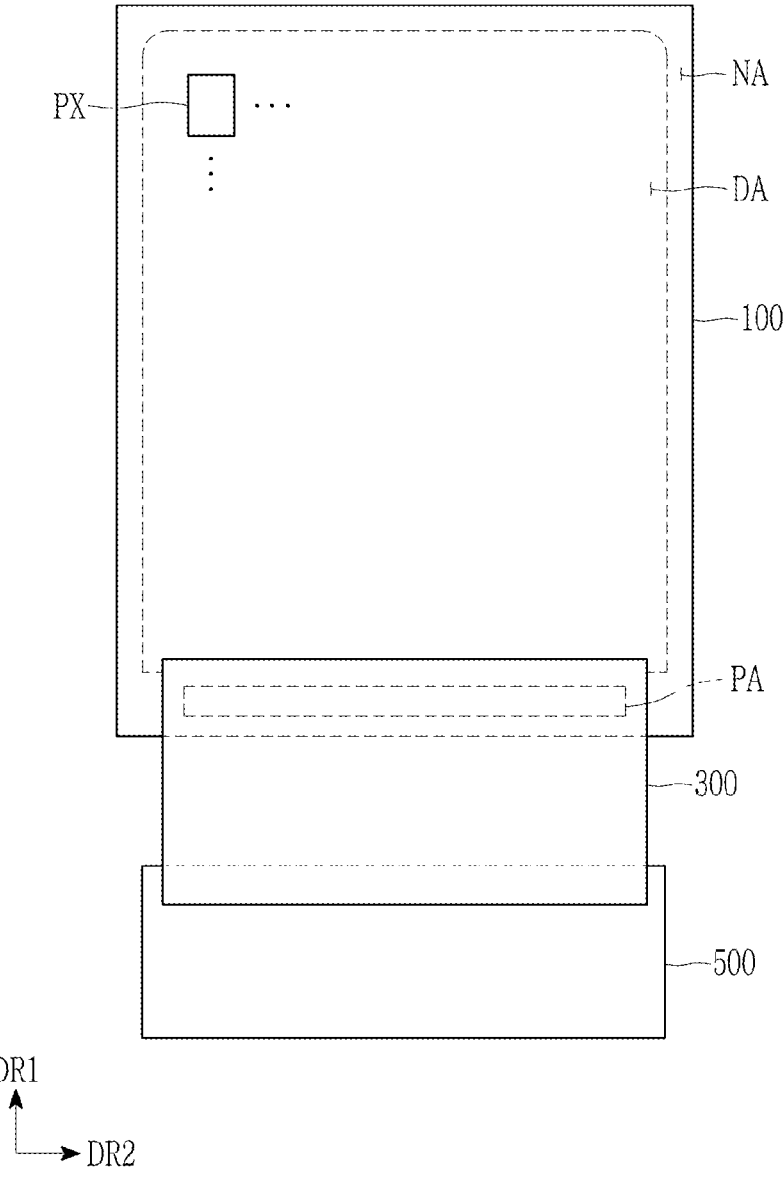
FIG. 1 shows a top plan view of a display device according to an embodiment.

The invention will be described more fully hereinafter with reference to the accompanying drawings, in which embodiments of the invention are shown. As those skilled in the art would realize, the described embodiments may be modified in various different ways, all without departing from the spirit or scope of the present disclosure.

Parts that are irrelevant to the description will be omitted to clearly describe the invention, and the same elements will be designated by the same reference numerals throughout the specification.

Parts that are irrelevant to the description are omitted to clearly describe the present disclosure, and like reference numerals designate like elements throughout the specification. For better understanding and ease of description, the thicknesses of layers, films, panels, regions, etc., are enlarged for clarity. The thicknesses of some layers and areas are exaggerated.

It will be understood that when an element such as a layer, film, region, or substrate is referred to as being related to another element such as being "on" another element, it can be directly on the other element or intervening elements may also be present. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The word "on" or "above" means disposed on or below the object portion, and does not necessarily mean disposed on the upper side of the object portion based on a gravitational direction.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. As used herein, a reference number may indicate a singular element or a plurality of the element. For example, a reference number labeling a singular form of an element within the drawing figures may be used to reference a plurality of the singular element within the text of specification.

"At least one" is not to be construed as limiting "a" or "an." "Or" means "and/or." As used herein, the term "and/or" includes any and all combinations of one or more of the associated listed items. Unless explicitly described to the contrary, the word "comprise" and variations such as "comprises" or "comprising" will be understood to imply the inclusion of stated elements but not the exclusion of any other elements.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within +30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

The phrase "in a plan view" means viewing a target portion from the top, and the phrase "in a cross-sectional view" means viewing a cross-section formed by vertically cutting a target portion from the side.

A display device according to an embodiment of the invention will now be described with reference to accompanying drawings.

FIG. 1 shows a top plan view of a display device according to an embodiment. Referring to FIG. 1, the display device may include a display panel 100 for displaying images, a printed circuit film 300 connected to the display panel 100, and a main circuit board 500 connected to the printed circuit film 300.

The display panel 100 includes a display area DA including a plurality of pixel areas including a plurality of pixels PX, and a non-display area NA which is adjacent to the display area DA, such as being disposed around the display area DA. The display area DA may have a rectangular shape (e.g., a rectangular planar shape) with linear corners in a plan view, or a rectangular shape with round corners in the plan view. The display area DA may have short sides and long sides. The short sides of the display area DA may be sides extended in a second direction DR2. The long sides of the display area DA may be sides extended in a first direction DR1 crossing the second direction DR2. The planar shape of the display area DA is not limited to the rectangle, and may have various shapes such as a circle or an oval.

The non-display area NA may be disposed adjacent to (or near) the respective short sides and the respective long sides of the display area DA. In this case, the non-display area NA may be adjacent to all sides of the display area DA to surround the display area DA, and may configure an edge of the display area DA. However, without being limited thereto, the non-display area NA may be disposed near the respective short sides or the respective long sides of the display area DA.

The non-display area NA of the display panel 100 includes a pad area PA. The pad area PA may be disposed near one short side of the display area DA. Without being limited thereto, the pad area PA may be disposed near the respective short sides of the display area DA or may be disposed near the respective short sides and the respective long sides of the display area DA.

A pixel PX of the display panel 100 may be provided in plural including a plurality of pixels PX. The pixels PX of the display panel 100 may include a plurality of transistors and light-emitting devices which are connected thereto. The pixels PX may include a semiconductor layer, a plurality of conductive layers, and an insulating layer positioned among the conductive layers, and signals are applied by the conductive layers so the pixels PX are operable.

The pixel PX may include three data conductive layers. The pixel PX including three data conductive layers may reduce generation of heat as compared to the pixel PX including only one or two data conductive layers, may increase a freedom degree when designing wires of the pixel PX, and may reduce the size (e.g., a planar area or planar dimension) of the pixel PX.

Figure 2:
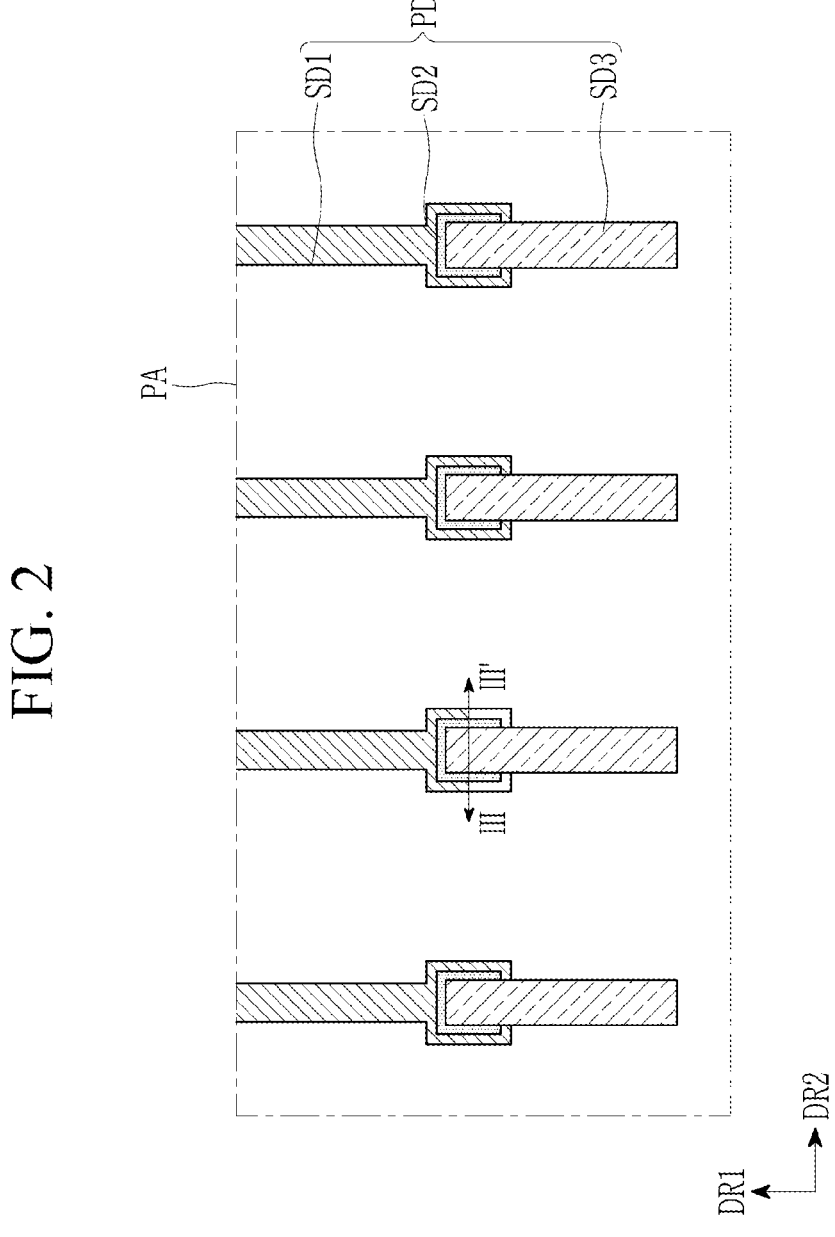
FIG. 2 shows a pad of a pad region according to an embodiment.

FIG. 2 shows a pad area PA. A pad PD provided in plural including a plurality of pads PD, are positioned in the pad area PA. The pads PD may include three data conductive layers in this instance.

Referring to FIG. 2, the pads PD may include a first data conductive layer SD1, a second data conductive layer SD2, and a third data conductive layer SD3 in order. When the pad PD is formed to have a multi-layered structure of the first data conductive layer SD1, the second data conductive layer SD2, and the third data conductive layer SD3, this may generate the same effect as increasing a total thickness of the pad PD and may reduce resistance (e.g., electrical resistance) of the pad PD. The first data conductive layer SD1 of the pad PD may extend from the non-display area NA and into to the display area DA, and may be connected to the pixel PX of the display area DA. In an embodiment, for example, the display area DA includes a first conductive layer, a second conductive layer and a third conductive layer in order along the thickness direction of the display device, the first data conductive layer SD1 of the pad PD is in a same layer as the first conductive layer of the display area DA, the second data conductive layer SD2 of the pad PD is in a same layer as the second conductive layer of the display area DA, and the third data conductive layer SD3 of the pad PD is in a same layer as the third conductive layer of the display area DA. As being 'in a same layer' as each other, elements may be formed in a same process, may include a same material, may be respective portions (or patterns) of a same material layer, may be on a same layer by forming an interface with a same underlying or overlying layer, etc., without being limited thereto.

A portion of an insulating layer may be removed or omitted from the upper portion of the pad PD (e.g., at the third data conductive layer SD3), and the third data conductive layer SD3 may contact the printed circuit film 300 to connect the pad PD to the printed circuit film 300. A portion of the third data conductive layer SD3 may define an exposed portion of the pad PD. As being in contact, elements may form an interface therebetween, without being limited thereto.

Figure 3:
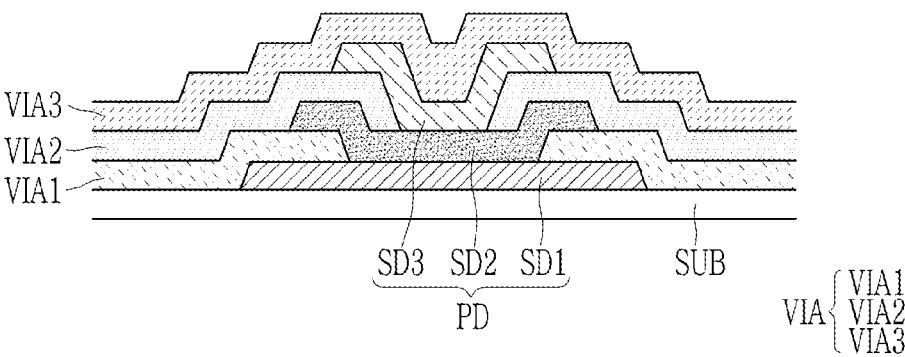
FIG. 3 shows a cross-sectional view with respect to line III-III' of FIG. 2.

FIG. 3 shows a cross-sectional view with respect to line III-III' of FIG. 2. Referring to FIG. 3, insulating layers VIA are positioned among (and between) the first data conductive layer SD1, the second data conductive layer SD2, and the third data conductive layer SD3 within the pad PD, on a substrate SUB. The insulating layers VIA may include a first insulating layer VIA1, a second insulating layer VIA2, and a third insulating layer VIA3.

In detail, the first insulating layer VIA1 may be positioned between the first data conductive layer SD1 and the second data conductive layer SD2, and the second insulating layer VIA2 may be positioned between the second data conductive layer SD2 and the third data conductive layer SD3. The third insulating layer VIA3 may be positioned on the third data conductive layer SD3. The first data conductive layer SD1 may contact the second data conductive layer SD2 through an opening formed (or defined) in the first insulating layer VIA1, and the second data conductive layer SD2 may contact the third data conductive layer SD3 through an opening formed in the second insulating layer VIA2.

The pad PD represents a portion of conductive layers at which the display panel 100 is connected to the printed circuit film 300, such as contacting the printed circuit film 300. As such, since the display panel 100 is connected to the printed circuit film 300 at the pad PD, a portion of the insulating layers VIA of the pad PD are removed from the connected portion of the pad PD. As the display device includes three data conductive layers and the insulating layers VIA are defined by a triple-layered structure, the insulating layers VIA has a high step with respect to a plane or reference surface, such as the substrate SUB. With the step, a residual film may be generated in an edge region of the pad PD at which the insulating layers VIA is removed.

Figure 4:
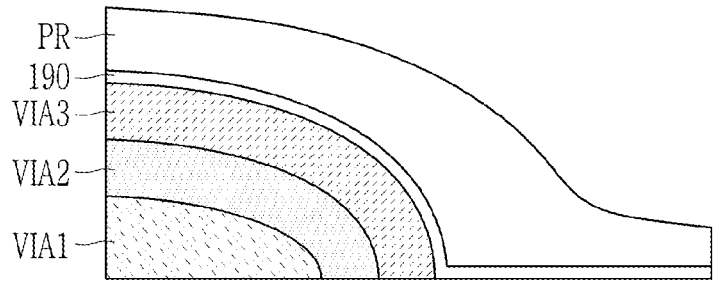
FIG. 4 to FIG. 6 show a process which generates a residual film in a structure in which an insulating layer is multi-layered.
Figure 5:
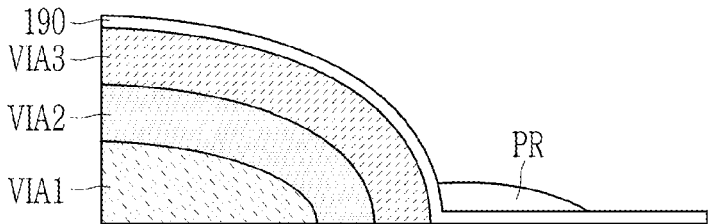
Figure 6:
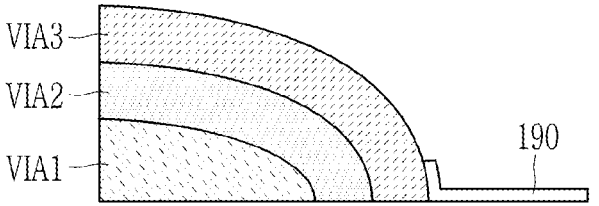

FIG. 4 to FIG. 6 show a process which generates a residual film in a structure in which an insulating member is multi-layered. As shown in FIG. 4, the first insulating layer VIA1 is positioned on the innermost side, and the second insulating layer VIA2 is positioned to cover the first insulating layer VIA1 in the structure in which the first insulating layer VIA1, the second insulating layer VIA2, and the third insulating layer VIA3 are sequentially stacked. The third insulating layer VIA3 is then positioned to cover the second insulating layer VIA2.

A first electrode conductive layer 190 is positioned on the third insulating layer VIA3. The first electrode conductive layer 190 is on the third insulating layer VIA3 in the non-display area NA since when a first electrode (not shown) of the pixel PX of the display area DA is formed, the first electrode conductive layer 190 is evenly formed in the display area DA and in the non-display area NA. As such, the first electrode (not shown) is formed through patterning the first electrode conductive layer 190 in the display area DA while the first electrode conductive layer 190 remains on the third insulating layer VIA3 in the non-display area NA.

Therefore, as shown in FIG. 4, a photoresist PR is positioned on the first electrode conductive layer 190. In this instance, since the insulating layers VIA is thick as it has a triple-layered structure, a step region including steps is generated. In the step region, the photoresist PR may be formed to be thicker than other regions.

As shown in FIG. 5, the photoresist is patterned and developed. A complete removal of the photoresist PR in the non-display area NA is desired, but since the photoresist PR is formed to be relatively thick at the step region at an end of the insulating layers VIA, part of the photoresist PR (e.g., a thickness portion) may not be removed but may remain within the non-display area NA. As the photoresist PR is removed through a same exposure from the entire region of the display area DA and the non-display area NA, some of the photoresist PR may not be removed but may remain in the portion where the photoresist PR is thick. FIG. 5 shows the configuration in which a thickness portion of the photoresist PR is not removed but remains in the step region of the insulating layers VIA.

Referring to FIG. 6, the first electrode conductive layer 190 is patterned. Here, complete removal of the first electrode conductive layer 190 in the non-display area NA is desired. However, as shown in FIG. 6, owing to the remaining portion of the photoresist PR in a region of the first electrode conductive layer 190, the first electrode conductive layer 190 covered by the photoresist PR is not removed but remains. When the first electrode conductive layer 190 remains in the non-display area NA as described above, a short circuit may be caused with the pad PD in the non-display area NA and may generate display defects.

However, the display device according to one or more embodiment has solved the short circuit issue by changing a thickness of the edge of the insulating layers VIA in the non-display area NA.

Figure 7:
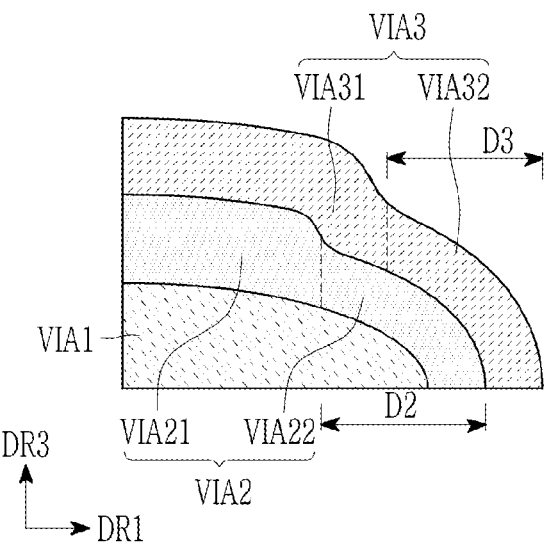
FIG. 7 shows an edge of an insulating layer of a display device according to an embodiment.

FIG. 7 shows an edge of an insulating layer VIA of a display device according to an embodiment. Referring to FIG. 7, the thickness of the edges of the second insulating layer VIA2 and the third insulating layer VIA3 according to the embodiment are thinner than at other (remaining) portions of the respective insulating layers.

That is, the second insulating layer VIA2 includes a thick first portion (e.g., a first portion VIA21) and a thin second portion (e.g., a second portion VIA22). That is, each insulating layer has a thickness, and the thickness of the second insulating layer VIA2 at the first portion VIA21 is greater than the thickness of the second portion VIA22. The thickness of the second portion VIA22 in this instance may be about 30% to about 50% of the thickness of the first portion VIA21. The second portion VIA22 may be formed by using a halftone mask at the edge in a process for patterning a second insulating material layer for providing the second insulating layer VIA2. The thickness of a respective insulating layer may be taken in a direction normal to a surface of an underlying layer, at a position along the respective insulating layer. Respective thicknesses along an entirety of a thin second portion of an insulating layer may be smaller than thicknesses along an entirety of a thick first portion of the same insulating layer.

The thin second portion may have a first end closest to the edge of the insulating layers VIA, and a second end which is opposite to the first end and forms a boundary with the thick first portion. The second end may be a location where the thickness of the respective insulating layer decreases. The thin second portion has a length along the substrate SUB, in a direction toward the outer edge of the insulating layers VIA. The length may be defined between the first and second ends of the thin second portion. Referring to FIG. 7, a first length D2 of the second portion VIA22 of the second insulating layer VIA2 in (or along) the first direction DR1 may be about 20 micrometers (μm) to about 100 μm. This corresponds to a range for efficiently reducing the steps within the pad structure.

The third insulating layer VIA3 may include a thick first portion (e.g., a first portion VIA31) and a thin second portion (e.g., a second portion VIA32) which has a thickness smaller than the thickness of the first portion VIA31. The thickness of the second portion VIA32 may be about 30% to about 65% of the thickness of the first portion VIA31. The second portion VIA32 may be formed by using a halftone mask at the edge in a process for patterning a third insulating material layer for providing the second insulating layer VIA2.

The second portion VIA32 of the third insulating layer VIA3 may be positioned further outside than the second portion VIA22 of the second insulating layer VIA2. The second end of the second portion VIA32 is closer to the outer edge of the insulating layers VIA than the second end of the second portion VIA22. That is, part of the second portion VIA22 of the second insulating layer VIA2 may overlap the first portion VIA31 of the third insulating layer VIA3. This is, however, an example, and the second portion VIA32 of the third insulating layer VIA3 may be positioned further inside than the second portion VIA22 of the second insulating layer VIA2 is according to an embodiment.

A second length D3 of the second portion VIA32 of the third insulating layer VIA3 in the first direction DR1 may be about 20 μm to about 100 μm. This corresponds to the range for efficiently reducing the steps within the pad structure.

Figure 8:
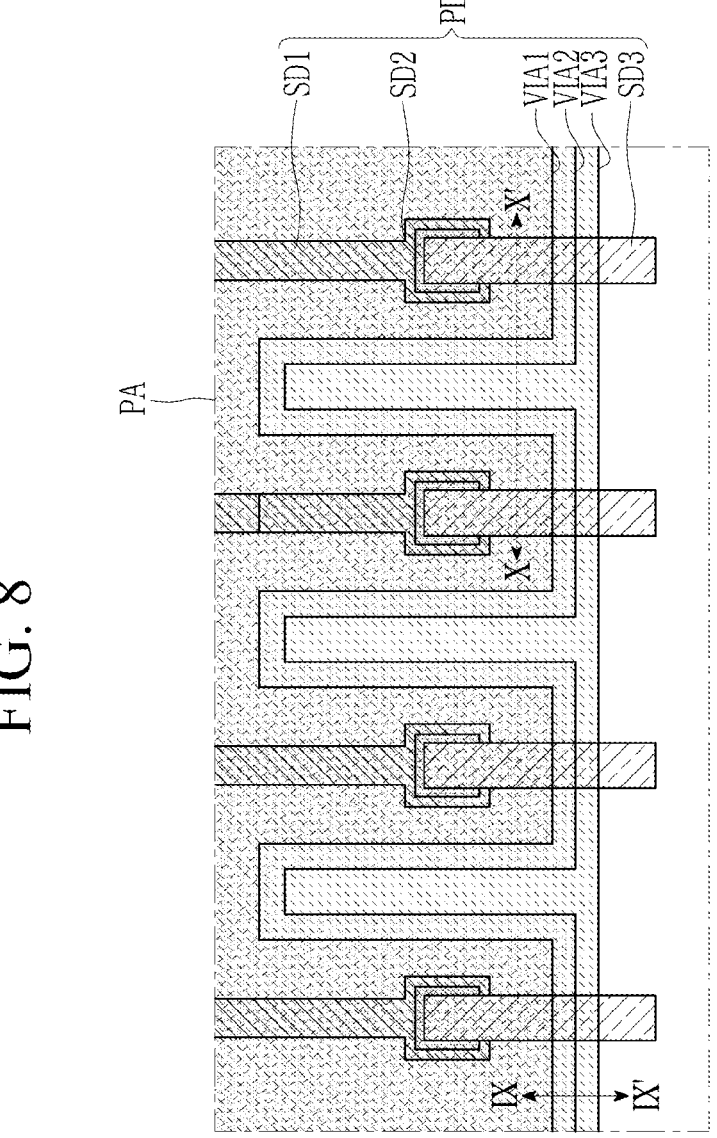
FIG. 8 shows a first insulating layer, a second insulating layer and a third insulating layer, relative to the pad of FIG. 2.
Figure 8:
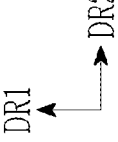

FIG. 8 shows a first insulating layer VIA1, a second insulating layer VIA2, and a third insulating layer VIA3, with relative to the structure in FIG. 2. Referring to FIG. 8, thickness portions of the first insulating layer VIA1, the second insulating layer VIA2, and the third insulating layer VIA3 may be omitted in the pad area PA, and one or more conductive layer of the pad PD may be exposed to outside the insulating layers VIA. The pad PD includes an overlapping region overlapping one or more of the insulating layer VIA, and a non-overlapping region not overlapping the insulating layers VIA. The non-overlapping region is exposed to outside the insulating layers VIA to define an exposed portion of the pad PD. The exposed portion of the pad PD extends further than an outer edge of the insulating layers VIA. Within the pad area PA, the pad PD of the display panel 100 contacts the printed circuit film 300 of FIG. 1 to connect the display panel 100 to the printed circuit film 300.

Figure 9:
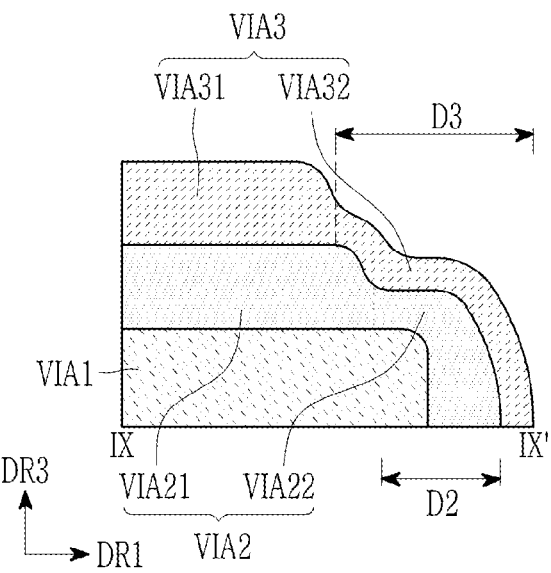
FIG. 9 shows a cross-sectional view with respect to line IX-IX' of FIG. 8.

FIG. 9 shows a cross-sectional view with respect to line IX-IX' of FIG. 8 at the outer edge of the insulating layers VIA. Referring to FIG. 9, the insulating layers VIA according to the embodiment has a step structure of which the edge is thinner than other portions, as shown in FIG. 7. The second insulating layer VIA2 includes a thick first portion (e.g., a first portion VIA21) and a thin second portion (e.g., a second portion VIA22). The thickness of the second portion VIA22 may be about 30% to about 50% of the thickness of the first portion VIA21.

The third insulating layer VIA3 may include a thick first portion (e.g., a first portion VIA31) and a thin second portion (e.g., a second portion VIA32). The thickness of the second portion VIA32 may be about 30% to about 50% of the thickness of the first portion VIA31.

The second portion VIA32 of the third insulating layer VIA3 may be positioned further inside than the second portion VIA22 of the second insulating layer VIA2 is. That is, part of the second portion VIA32 of the third insulating layer VIA3 may overlap the first portion VIA21 of the second insulating layer VIA2. The second end of the second portion VIA32 may be further from the outer edge of the insulating layers VIA than the second end of the second portion VIA22.

As edge portions of the second insulating layer VIA2 and the third insulating layer VIA3 are thin, the step at the edge of the insulating layers VIA may be minimized. Therefore, as shown in FIG. 4 to FIG. 6, the problem in which the residual film of the photoresist PR remains near the insulating layers VIA and the problem in which a residual portion of the first electrode conductive layer 190 is not etched but remains and generates a short circuit, may be solved.

A first length D2 of the second portion VIA22 of the second insulating layer VIA2 in the first direction DR1 may be about 20 μm to about 100 μm. A second length D3 of the second portion VIA32 of the third insulating layer VIA3 in the first direction DR1 may be about 20 μm to about 100 μm. This is the range for preventing the region occupied by the insulating layers VIA from becoming excessively great and efficiently reducing the step.

Figure 10:
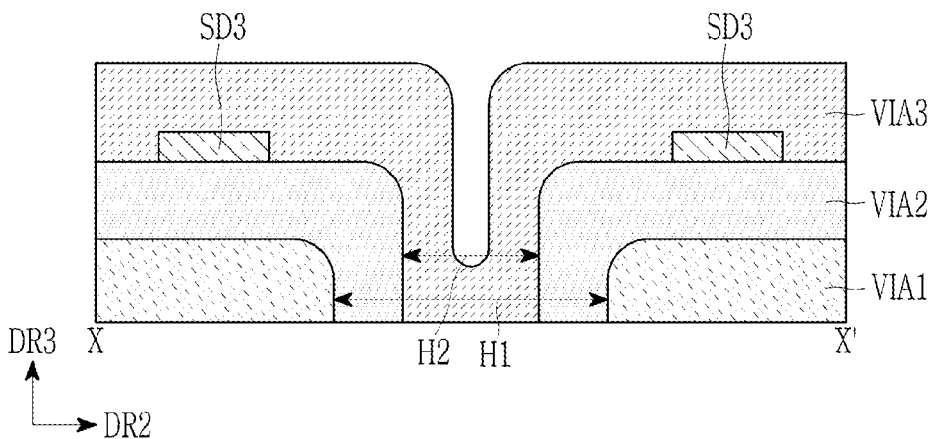
FIG. 10 shows a cross-sectional view with respect to line X-X' of FIG. 8.

FIG. 10 shows a cross-sectional view with respect to line X-X' of FIG. 8, at an area between pads PD. Referring to FIG. 10, regarding the display device according to the embodiment, a first groove H1 at which the first insulating layer VIA1 is removed and a second groove H2 at which the second insulating layer VIA2 is removed are positioned in a region between the pads PD neighboring each other. A portion of the third insulating layer VIA3 may have a similar shape to the groove formed by the first groove H1 and the second groove H2.

Side surfaces (or lateral surfaces) of respective insulating layers may define a respective groove. A lateral side of the first insulating layer VIA1 is covered by the second insulating layer VIA2, and a lateral side of the second insulating layer VIA is covered by the third insulating layer VIA3.

Therefore, even when the residual film is generated in the region between the pads PD adjacent to each other, the residual film may be covered by the insulating layers VIA on the respective layers, to thus prevent the short circuit between adjacent pads PD. For example, when the residual film of the second data conductive layer SD2 of the pad PD is generated, it is covered by the third insulating layer VIA3, and is not short-circuited with other portions of the third data conductive layer SD3. In a like manner, when the residual film of the first data conductive layer SD1 of the pad PD is generated, this is covered by the second insulating layer VIA2, and is not short-circuited with other portions of the second data conductive layer SD2 or other portions of the third data conductive layer SD3.

A first spaced distance (e.g., length of the first groove H1) between facing side surfaces of the first insulating layers VIA1 may be about 20 μm to about 100 μm. A second spaced distance (e.g., length of the second groove H2) between facing side surfaces of the second insulating layers VIA2 may be about 20 μm to about 100 μm. The first spaced distance may be greater than the second spaced distance.

Figure 11:
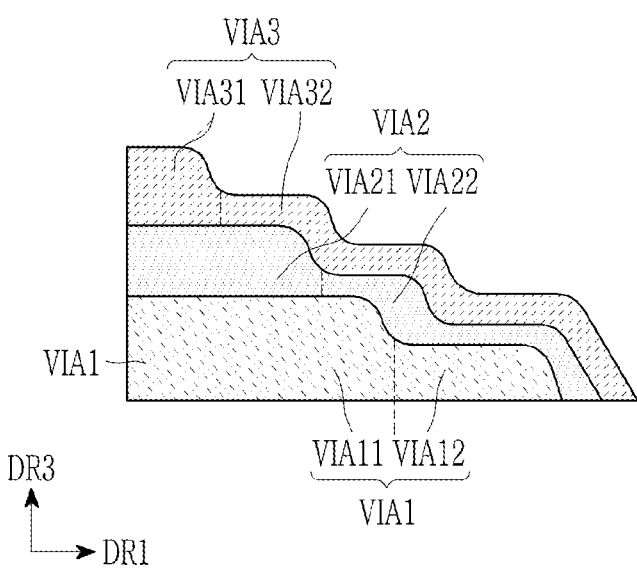
FIG. 11 shows a same cross-section as FIG. 9 according to an embodiment.

FIG. 11 shows a same cross-section as FIG. 9 according to an embodiment. What is described with reference to FIG.

11 corresponds to what is described with reference to FIG. 9 except that the first insulating layer VIA1 includes a second portion VIA12 that is thinner than the first portion VIA11, and the first portion VIA11. No same constituent elements will be described in detail. The first insulating layer VIA1 shown in FIG. 11 includes the first portion VIA11 and the second portion VIA12 so the step of the insulating layers VIA may be further gently reduced.

Figure 12:
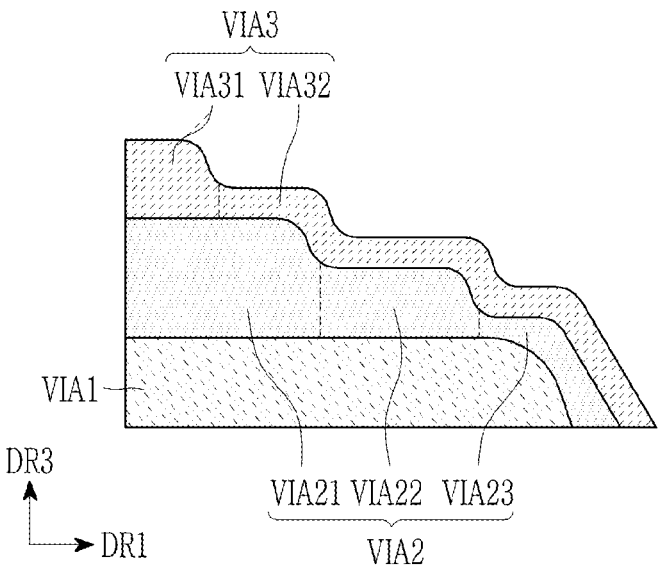
FIG. 12 shows a same cross-section as FIG. 9 according to an embodiment.

FIG. 12 shows a same cross-section as FIG. 9 according to an embodiment. Referring to FIG. 12, regarding the display device according to an embodiment, the second insulating layer VIA2 includes a first portion VIA21, a second portion VIA22, and a third portion VIA23 having different thicknesses from each other. When the second insulating layer VIA2 has three thicknesses as described, the steps may be further gently reduced, which is desirable. Thicknesses of the portions of the second insulating layer VIA2 decrease in a direction toward the outer edge of the insulating layers VIA.

Figure 13:
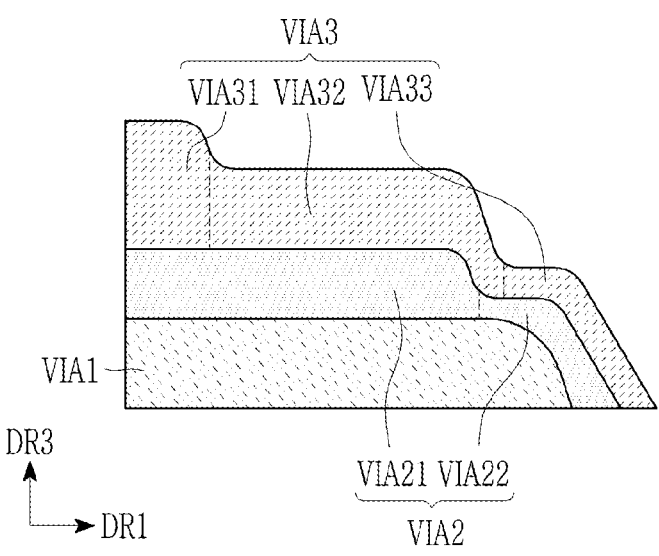
FIG. 13 shows a same cross-section as FIG. 9 according to an embodiment.

FIG. 13 shows a same cross-section as FIG. 9 according to an embodiment. Referring to FIG. 13, regarding the display device according to an embodiment, the third insulating layer VIA3 includes a first portion VIA31, a second portion VIA32, and a third portion VIA33 of which the thicknesses are different from each other. When the third insulating layer VIA3 has three thicknesses, the steps may be further gently reduced, which is desirable.

Figure 14:
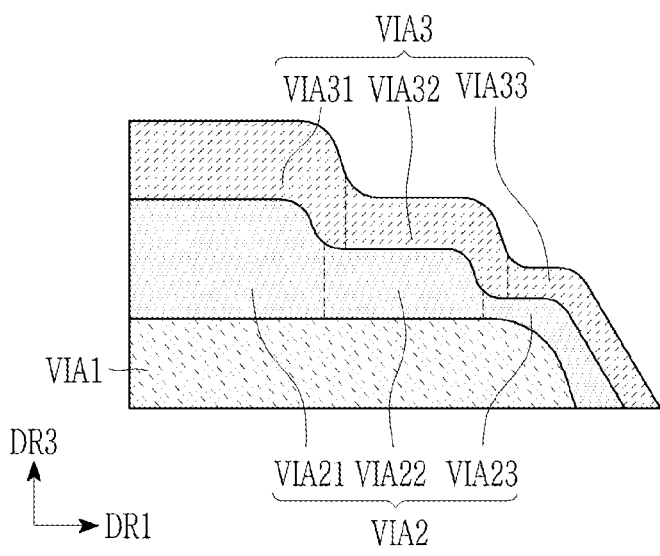
FIG. 14 shows a same cross-section as FIG. 9 according to an embodiment.

FIG. 14 shows a same cross-section as FIG. 9 according to an embodiment. Referring to FIG. 14, regarding the display device according to an embodiment, the second insulating layer VIA2 includes a first portion VIA21, a second portion VIA22, and a third portion VIA23 having different thicknesses, and the third insulating layer VIA3 includes a first portion VIA31, a second portion VIA32, and a third portion VIA33 having different thicknesses. When the second insulating layer VIA2 and the third insulating layer VIA3 respectively have three thicknesses, the steps may be further gently reduced, which is desirable.

Figure 15:
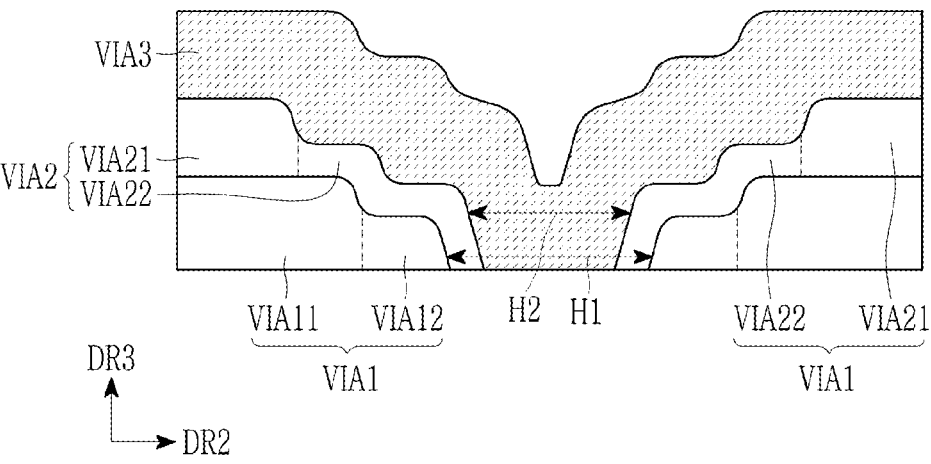
FIG. 15 shows a same cross-section as FIG. 10 according to an embodiment.

FIG. 15 shows a same cross-section as FIG. 10 according to an embodiment. Referring to FIG. 15, in an embodiment, the first insulating layer VIA1 includes a first portion VIA11 and a second portion VIA12 that is thinner than the first portion VIA11, and the second insulating layer VIA2 includes a first portion VIA21 and a second portion VIA22 that is thinner than the first portion VIA21. When the first insulating layer VIA1 and the second insulating layer VIA2 include a step structure as described, the step may become gentle on the end of the insulating layers VIA, and a possibility of generation of the conductive layer residual film may be reduced.

Regarding the display device according to one or more embodiment, the insulating layers VIA include multiple layers in the pad area PA of the non-display area NA, and the edge thickness portions of the insulating layers VIA of the respective layers are relatively thin. Therefore, the step of the insulating layers VIA may be minimized at the end of the insulating layers VIA, and the problem of the generation of a residual film of the first electrode conductive layer 190 by the step may be solved. In addition, the widths of the respective insulating layers in the region between a plurality of pads PD are different. That is, the lateral side of the first insulating layer VIA1 is covered by the second insulating layer VIA2, and the lateral side of the second insulating layer VIA2 is covered by the third insulating layer VIA3. Therefore, when the residual film of the first data conductive layer SD1, the second data conductive layer SD2, or the third data conductive layer SD3 is generated in the region between a plurality of pads PD, it may be covered by the respective insulating layers, and the short circuit may be prevented. That is, an upper insulating layer covers a residual conductive layer on a lower insulating layer, to reduce or effectively prevent the short circuit.

While this invention has been described in connection with what is presently considered to be embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:

a display area and a non-display area which is adjacent to the display area;

a pad in the non-display area and connected to the display area, the pad including a first data conductive layer and a second data conductive layer in order along a thickness direction of the display device; and insulating layers on the pad, the insulating layers including:

a first insulating layer between the first data conductive layer and the second data conductive layer, in the thickness direction of the display device, and a second insulating layer on the second data conductive layer, wherein within the non-display area:

a portion of the pad is exposed outside of the insulating layers to define an exposed portion of the pad, an insulating layer among the insulating layers includes a first portion having a first thickness and a second portion having a second thickness which is less than the first thickness, and the second portion of the insulating layer is between the exposed portion of the pad and the first portion of the insulating layer.

2. A display device comprising:

a display area and a non-display area which is adjacent to the display area;

a pad in the non-display area and connected to the display area; and an insulating layer on the pad, wherein a portion of the pad is exposed outside of the insulating layer to define an exposed portion of the pad, the insulating layer includes a first portion having a first thickness and a second portion having a second thickness which is less than the first thickness, the second portion of the insulating layer is between the exposed portion of the pad and the first portion of the insulating layer, and a length of the second portion is about 20 micrometers to about 100 micrometers.

3. The display device of claim 1, wherein each of the first portion and the second portion of the insulating layer has a thickness, and the thickness of the second portion is about 30% to about 50% of the thickness of the first portion.

4. The display device of claim 1, wherein the pad further includes the first data conductive layer, the second data conductive layer, and a third data conductive layer in order along the thickness direction of the display device, and the insulating layers further include:

the second insulating layer between the second data conductive layer and the third data conductive layer, in the thickness direction of the display device, and a third insulating layer on the third data conductive layer.

5. The display device of claim 1, wherein an end of the insulating layer is defined at a boundary between the first portion having the first thickness and the second portion having the second thickness which is less than the first thickness, and the end of the second insulating layer is nearer the exposed portion of the pad than the end of the first insulating layer.

6. The display device of claim 4, wherein an end of the insulating layer is defined at a boundary between the first portion having the first thickness and the second portion having the second thickness which is less than the first thickness, and the end of the third insulating layer is nearer the exposed portion of the pad than the end of the second insulating layer.

7. The display device of claim 1, wherein among the first insulating layer and the second insulating layer, the first insulating layer includes the first portion having the first thickness and the second portion having the second thickness which is less than the first thickness.

8. The display device of claim 1, wherein among the first insulating layer and the second insulating layer, the second insulating layer includes the first portion having the first thickness and the second portion having the second thickness which is less than the first thickness.

9. The display device of claim 4, wherein among the first insulating layer, the second insulating layer and the third insulating layer, the third insulating layer includes the first portion having the first thickness and the second portion having the second thickness which is less than the first thickness.

10. The display device of claim 4, wherein the display area includes a first conductive layer, a second conductive layer and a third conductive layer in order along the thickness direction of the display device, the first data conductive layer of the pad is in a same layer as the first conductive layer of the display area, the second data conductive layer of the pad is in a same layer as the second conductive layer of the display area, and the third data conductive layer of the pad is in a same layer as the third conductive layer of the display area.

11. The display device of claim 10, wherein an opening is defined in the first insulating layer and the second insulating layer, and within the pad:

the first data conductive layer and the second data conductive layer contact each other in the opening in the first insulating layer, and the second data conductive layer and the third data conductive layer contact each other in the opening in the second insulating layer.

12. The display device of claim 11, wherein the first data conductive layer of the pad is connected to the display area, and the third data conductive layer of the pad defines the exposed portion of the pad.

13. The display device of claim 1, wherein the insulating layer further includes a third portion having a third thickness which is less than the second thickness, and the third portion of the insulating layer is between the exposed portion of the pad and the second portion of the insulating layer.

14. The display device of claim 1, wherein
the pad is provided in plural including neighboring pads,
   and
the first insulating layer defines a first groove between the
   neighboring pads.
15. The display device of claim 14, wherein
a width of the first groove between the neighboring pads
   is about 20 micrometers to about 100 micrometers.
16. The display device of claim 14, wherein
the second insulating layer defines a second groove
   between the neighboring pads and corresponds to the
   first groove in the first insulating layer,
the first insulating layer includes a lateral side which
   defines the first groove, and
the lateral side of the first insulating layer is covered by
   the second insulating layer.
17. The display device of claim 16, wherein
a width of the second groove in the second insulating
   layer is less than a width of the first groove in the first
   insulating layer.
18. The display device of claim 16, wherein
the pad further includes the first data conductive layer, the
   second data conductive layer, and a third data conduc-
   tive layer in order along the thickness direction of the
   display device,
the insulating layers further include;

the second insulating layer between the second data
   conductive layer and the third data conductive layer,
   in the thickness direction of the display device, and
a third insulating layer on the third data conductive
   layer,
the second insulating layer includes a lateral side which
   defines the second groove, and
the lateral side of the second insulating layer is covered by
   the third insulating layer.
19. The display device of claim 14, wherein among the
first insulating layer and the second insulating layer,
the first insulating layer includes:
   the first portion having the first thickness and the
      second portion having the second thickness which is
      less than the first thickness, and
   the second portion between the first portion and the first
      groove.
20. The display device of claim 16, wherein among the
first insulating layer and the second insulating layer,
the second insulating layer includes:
   the first portion having the first thickness and the
      second portion having the second thickness which is
      less than the first thickness, and
   the second portion between the first portion and the
      second groove.

* * * * *